United States Patent
Wurzer et al.

(10) Patent No.: US 10,153,775 B1
(45) Date of Patent: Dec. 11, 2018

(54) PHASE INTERPOLATOR

(71) Applicant: Micron Technology, Inc., Boise, ID (US)

(72) Inventors: Steven G. Wurzer, Blaine, MN (US); Neil Petrie, St. Louis Park, MN (US); Joseph P. Kerzman, New Brighton, MN (US); Kevin R. Duncan, Ramsey, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/701,689

(22) Filed: Sep. 12, 2017

(51) Int. Cl.
 *H03B 28/00* (2006.01)
 *H03L 7/099* (2006.01)
 *G11B 20/14* (2006.01)

(52) U.S. Cl.
 CPC ........ *H03L 7/0998* (2013.01); *G11B 20/1426* (2013.01); *H03B 28/00* (2013.01)

(58) Field of Classification Search
 CPC ..... G04F 10/005; H03L 7/0998; H03B 28/00; G11B 20/1426
 See application file for complete search history.

(56) References Cited

U.S. PATENT DOCUMENTS

| | | |
|---|---|---|
| 6,369,661 B1 | 4/2002 | Scott et al. |
| 7,466,179 B2 | 12/2008 | Huang et al. |
| 8,253,454 B2 | 8/2012 | Lin |
| 8,636,773 B2 | 1/2014 | Stern et al. |
| 9,667,236 B1 | 5/2017 | Cho et al. |
| 2014/0321515 A1* | 10/2014 | Ponton ................... H03H 11/20 375/219 |
| 2018/0097523 A1* | 4/2018 | Hoshyar ............... H03L 7/1976 |

* cited by examiner

*Primary Examiner* — Sung Ahn
(74) *Attorney, Agent, or Firm* — Brooks, Cameron & Huebsch, PLLC

(57) ABSTRACT

Apparatuses and methods for phase interpolators are provided. An example apparatus comprises a phase interpolator and a controller coupled to the phase interpolator. The controller is configured to provide a digital timing code to the phase interpolator, and the phase interpolator is configured to apply a correction to the received digital timing code based, at least in part, on phase interpolator error correction data from a data structure containing phase interpolator error correction data.

29 Claims, 3 Drawing Sheets

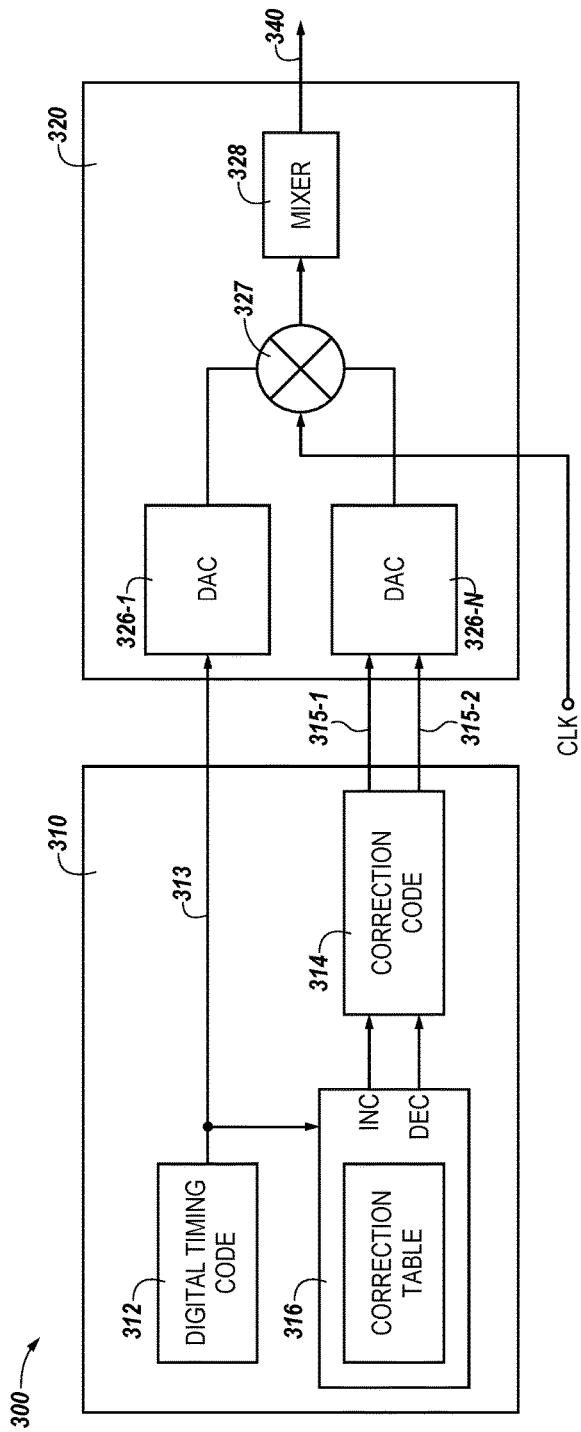
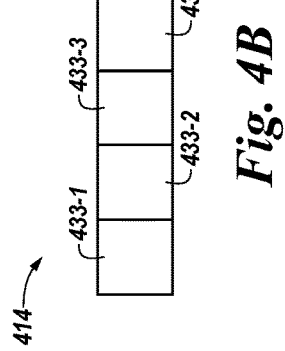
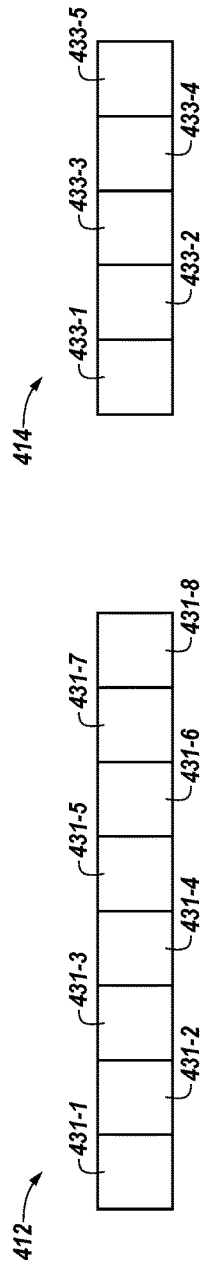
Fig. 3
Fig. 4A
Fig. 4B

PHASE INTERPOLATOR

TECHNICAL FIELD

The present disclosure relates generally to timing control of digital and analog circuits, and more particularly, to apparatuses and methods utilizing a phase interpolator for timing control of digital and analog circuits.

BACKGROUND

Digital and mixed digital-analog circuits and systems may operate based on timing clocks which may be generated from a master timing clock. These timing clocks may be generated using a programmable phase-locked loop (PLL) and associated control circuitry. However, PLLs are limited in their ability to generate signals with precise phase relationships.

Because state-of-the-art circuits and systems may require generation of clock signals that are more precise than clock signals generated using traditional PLLs, phase interpolator circuits may be used to provide improved timing control over circuits and systems that rely on precise timing. A phase interpolator is a circuit element that adds two or more signals having different phases and provides a single output having a phase somewhere between the phases of the input signals. Accordingly, phase interpolators may be used in applications in which precise timing is desirable; however, phase interpolators may exhibit integral non-linearity, which may limit the accuracy of the timing control provided by a phase interpolator.

BRIEF DESCRIPTION OF THE DRAWINGS

FIG. 3 is a block diagram of a system including a phase interpolator and controller in accordance with a number of embodiments of the present disclosure.

FIG. 4A is an example of a digital timing code in accordance with a number of embodiments of the present disclosure.

FIG. 4B is an example of a correction code in accordance with a number of embodiments of the present disclosure.

DETAILED DESCRIPTION

Figure 1:
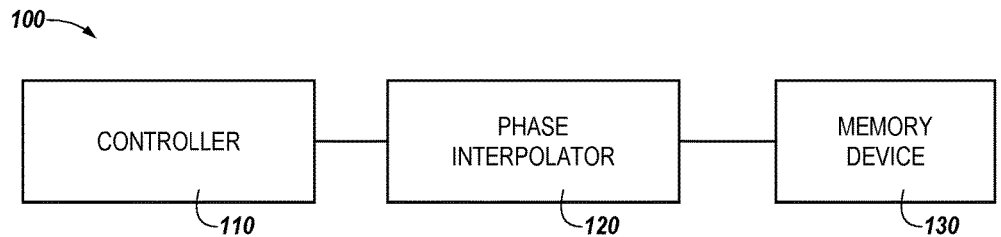
FIG. 1 is a block diagram of a system including a phase interpolator in accordance with a number of embodiments of the present disclosure.

The present disclosure includes apparatuses and methods associated with a phase interpolator. An example apparatus comprises a phase interpolator and a controller coupled to the phase interpolator. The controller is configured to provide a digital timing code to the phase interpolator, and the phase interpolator is configured to apply a correction to the received digital timing code based, at least in part, on phase interpolator error correction data from a data structure containing phase interpolator error correction data. As used herein, a "data structure" refers to a specialized format for organizing and/or storing data, which may or may not be organized in rows and columns. Examples of data structures include arrays, files, records, tables, trees, etc.

Timing interface circuits contain non-idealities which may limit the accuracy of the interface. For example, non-idealities such as integral nonlinearity (INL) errors may limit the operating frequency of the interface. In order to mitigate these limitations, correction techniques may be applied to reduce an INL error, thereby increasing the precision of timing signals generated by the circuit and increasing the accuracy of the interface.

Phase interpolators may exhibit non-linear delay behavior over a range of timing delays. Accordingly, it may be beneficial to apply correction techniques to mitigate the effects of the non-linear delay behavior of phase interpolators. In some approaches, if the non-linear delay behavior is deterministic, static correction may be applied to compensate for the non-linear delay behavior.

For example, in some approaches, INL error correction data over a full control range may be stored in non-volatile memory and/or may be executed as software instructions. Such schemes allow for the application of external INL error correction to compensate for circuit timing errors. For example, in some approaches, a table of error correction data which maps a requested delay with a control code to achieve a desired timing correction at the output of a phase interpolator, may be stored in non-volatile memory. In such approaches, the error correction data may include fixed shape correction register transfer level (RTL) data for each step associated with the phase interpolator. However, because the error correction data stored in the table is fixed in some approaches, it may be difficult to accurately compensate for non-linear delay behavior under different operating parameters.

For example, in situations where there is a variation in the INL error profile between different phase interpolators on a same chip, the application of a same (e.g., a fixed) shape correction to each phase interpolator on the chip may result in some phase interpolators experiencing an incorrect amount of correction. Further, in approaches in which the error correction data is fixed, it may be difficult to compensate for variations in the INL profile that can be based on varying process, voltage, and temperature (PVT) conditions, and/or variations in the INL profile that can be based on varying frequency operating parameters.

In contrast, embodiments of the present disclosure can include providing error correction to non-liner delay behavior utilizing a mathematical derivative of the required error correction data, which may allow for a smaller table to be required to store the error correction data as compared to approaches that do not utilize the mathematical derivative of the required error correction. This in turn may allow for the error correction data to be stored on-chip (e.g., on a controller) in a smaller table than in some previous approaches. Further, by storing and subsequently using the derivative of the error correction data to correct non-linear delay behavior, a full error correction data table may be reconstructed in hardware point-by-point as needed. In addition, because embodiments of the present disclosure allow for utilization of a smaller table space than some previous approaches, performance may be increased and cost may be reduced, as the die area utilized to perform error correction of the non-linear delay behavior may be reduced in comparison with some previous approaches. Although specific embodiments herein refer to a table, it will be appreciated that any suitable data structure may be used in place of a table.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of a system including a phase interpolator 120 in accordance with a number of embodiments of the present disclosure. The system 100 may include a controller 110, phase interpolator 120, and memory device 130. The controller 110 can be a state machine, sequencer, or some other type of controller and include hardware and/or firmware (e.g., microcode instructions) in the form of an application specific integrated circuit (ASIC). In a number of embodiments, the controller 110 can control generation of digital timing codes and the application of the digital timing codes to the phase interpolator 120 in association with performing error correction of non-linear delay behavior.

The phase interpolator 120 is configured to adjust the phase of its internal sampling clock(s) into fine increments. For example, the phase interpolator 120 may have a granularity of 512 steps per clock phase (e.g., 512 steps from a first rising edge of a clock cycle to a second rising edge of the clock cycle). Embodiments are not so limited; however, and the phase interpolator 120 may have a granularity of less than 512 steps per clock phase or a granularity of greater than 512 steps per clock phase.

In some embodiments, the phase interpolator 120 may be configured to mix two clocks (e.g., two timing codes) that are 90° out of phase with each other in each quadrant. For example, in polar coordinates, each 128 steps of the phase interpolator 120 may be represented in a respective quadrant of a Cartesian plane. For each respective quadrant, the phase interpolator 120 may be configured to mix received timing codes from two different sources, which are 90° out of phase with each other.

The memory device 130 can comprise a DRAM array, SRAM array, STT RAM array, PCRAM array, TRAM array, RRAM array, NAND flash array, and/or NOR flash array, for instance. The memory device 130 can comprise memory cells arranged in rows coupled by access lines and columns coupled by sense lines. In some embodiments, the memory device 130 may include a number of arrays (e.g., a number of banks of DRAM cells, NAND flash cells, etc.).

In some embodiments, the memory device 130 may be configured to operate as a device under test (DUT). For example, the memory device 130 may be operated as a DUT to test the functionality of the DUT either at first manufacture, or later during its life cycle as part of ongoing functional testing and/or calibration checks. In some embodiments, the memory device 130 may be configured to operate as a DUT to establish that the memory device 130 is performing in accordance with product specifications.

Figure 2:
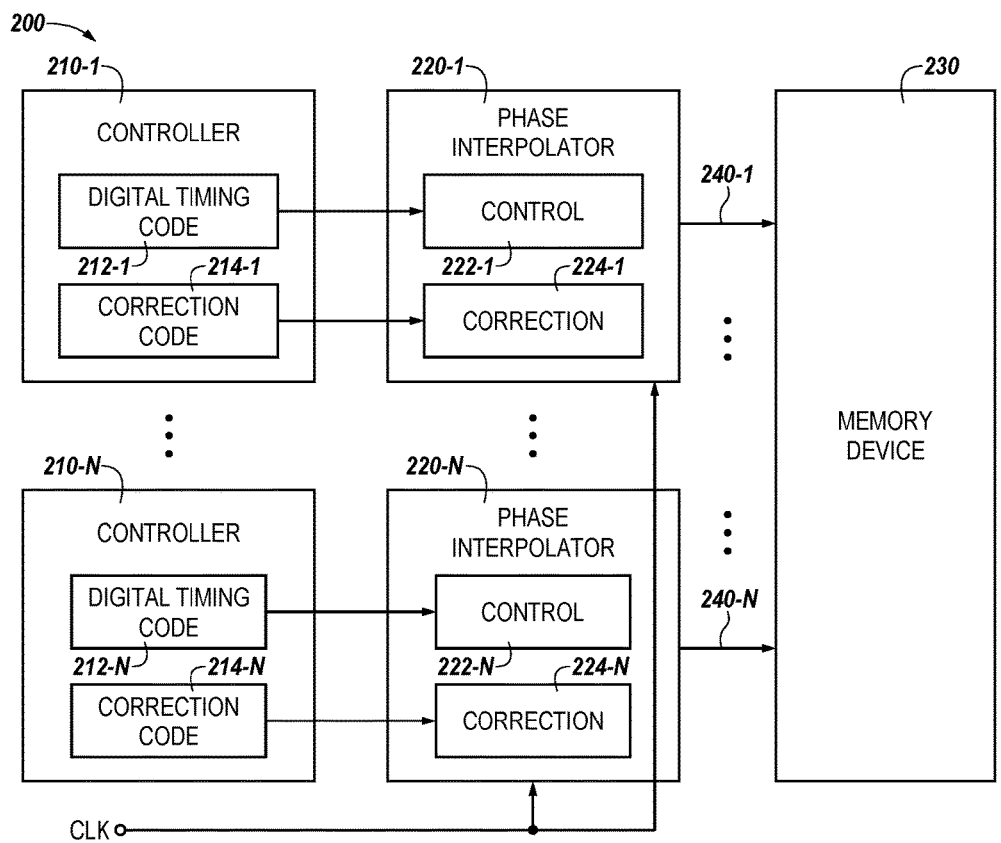
FIG. 2 is a block diagram of a system including a plurality of phase interpolators in accordance with a number of embodiments of the present disclosure.

FIG. 2 is a block diagram of a system 200 including a plurality of phase interpolators 220-1, . . . , 220-N in accordance with a number of embodiments of the present disclosure. The system 200 includes a plurality of controllers 210-1, . . . , 210-N, which are each coupled to respective phase interpolators among a plurality of phase interpolators 220-1, . . . , 220-N. The controllers 210-1, . . . , 210-N may each have a digital timing code 212-1, . . . , 212-N and a correction code 214-1, . . . , 214-N associated therewith.

The digital timing codes 212-1, . . . , 212-N may include sequences of numeric codes which may be generated at intervals by, for example, a timing synchronization system. The digital timing codes 212-1, . . . , 212-N may be received by control components 222-1, . . . , 222-N of the phase interpolators 220-1, . . . , 220-N. As described in more detail in connection with FIG. 3, herein, the control components 222-1, . . . , 222-N may be digital-to-analog converters (DACs).

The correction codes 214-1, . . . , 214-N may include sequences of numeric codes that represent an error correction applied to correct for non-linear delay behavior. In some embodiments, the correction codes 214-1, . . . , 214-N can include a derivative of an INL error profile associated with the phase interpolators 220-1, . . . , 220-N. The correction codes 214-1, . . . , 214-N may be received by correction components 224-1, . . . , 224-N of the phase interpolators 220-1, . . . , 220-N. As described in more detail in connection with FIG. 3, herein, the correction components 224-1, . . . , 224-N may be DACs.

In contrast to some previous approaches, the digital timing codes 212-1, . . . , 212-N and the correction codes 214-1, . . . , 214-N may be different for each respective controller 210-1, . . . , 210-N. For example, the digital timing code 212-1 and/or the correction code 214-1 associated with controller 210-1 may be different than the digital timing code 212-N and/or the correction code 214-N associated with controller 210-N.

In some embodiments, the phase interpolators 220-1, . . . , 220-N may be configured to transmit an error corrected timing signal to the memory device 230 via interfaces 240-1, . . . , 240-N. The error corrected timing signal may be a signal that has been adjusted by the phase interpolators 220-1, . . . , 220-N based on the correction codes 214-1, . . . , 214-N received by the phase interpolators 220-1, . . . , 220-N from the controllers 210-1, . . . , 210-N. For example, the correction components 224-1, . . . , 224-N may apply a correction based on the correction codes 214-1, . . . , 214-N and transmit the corrected signal to memory device 230 via interfaces 240-1, . . . , 240-N.

The system 200 may further include an external clock (CLK) to provide external timing signals to the phase interpolators 220-1, . . . , 220-N. In some embodiments, the CLK may be a central processing unit (CPU) clock. These external timing signals may control overall phase interpolator 220-1, . . . , 220-N timing. For example, the phase interpolators 220-1, . . . , 220-N may interpolate the received digital timing codes 212-1, ..., 212-N and/or the received correction codes 214-1, ..., 214-N during a clock cycle defined by the external timing signals generated by CLK. In some embodiments, the phase interpolators 220-1, ..., 220-N may have a granularity of 512 steps such that during one clock cycle generated by the external CLK, 512 intervals may be defined by the phase interpolators 220-1, ..., 220-N. As used herein, each "step" (or interval) represents an amount of delay applied to the external CLK signal.

FIG. 3 is a block diagram of a system 300 including a phase interpolator 320 and controller 310 in accordance with a number of embodiments of the present disclosure. The controller 310 may include a digital timing code 312, correction table 316 (e.g., a data structure containing phase interpolator error correction data), and correction code 314. The digital timing code 312 may be sent to the DAC 326-1 and the correction table 316 via signal path 313. In some embodiments, the digital timing code 312 may be an 8 bit digital timing code; however, embodiments are not so limited, and the digital timing code 312 may include more than 8 bits (e.g., 16 bits, etc.), or the digital timing code 312 may include fewer than 8 bits (e.g., 4 bits, etc.).

The correction table 316 may include a table of phase interpolator error correction data. In contrast to some previous approaches, the correction table 316 may not be fixed. For example, data stored in the correction table 316 may be changed either on the fly, during operation of the system 300, or during idle time of the system 300. In some embodiments, the correction table 316 comprises one or more storage locations to store the table of phase interpolator error correction data. As used herein, a "storage location" refers to one or more circuit components configured to store a bit or bits. Non-limiting examples of storage locations include registers, latching circuitry (e.g., flip-flops, cross-coupled latches, etc.), static random access memory (SRAM), etc. Because the correction table 316 may be changed (e.g., because the correction table 316 is not static), different phase interpolator error correction data may be loaded into the correction table 316 for different operating conditions of the system 300. For example, the phase interpolator error correction data stored in the correction table 316 may be changed to suit different PVT and/or frequency operating parameters of the system 300.

The phase interpolator error correction data stored in the correction table 316 may include a mathematical derivative of INL error data associated with the phase interpolator 320. By storing the derivative of the INL error data in the correction table 316, the amount of space required for the correction table 316 may be reduced in comparison with some previous approaches in which the full INL error data associated with the phase interpolator 320 is stored.

In some embodiments, the correction table 316 may comprise 512 storage locations (e.g., registers) that are each configured to store 2 bits of phase interpolator error correction data. In such an example, the correction table 316 may be configured to store 2×512 bits of phase interpolator error correction data in the correction table 316. For example, the correction table 316 may be configured to store 2 bits of error correction data for each of 512 steps of the phase interpolator 320. Embodiments are not so limited, however, and the correction table 316 may include fewer than 512 storage locations (e.g., 256 storage locations), or more than 512 storage locations (e.g., 1024 storage locations, etc.). Although shown as being part of the controller 310, the correction table 316 is not relegated to being part of the controller, and may be located off of the controller, so long as the correction table 316 is communicatively coupled to the controller 310.

In some embodiments, the correction table 316 may include data corresponding to a change in correction from a previous error corrected value. For example, the correction table 316 may be configured to adjust the correction code 314 incrementally from a previous error corrected value. In this example, a change in the correction from a previous data value stored in the correction table 316 may be incremented (e.g., at INC), decremented (e.g., at DEC), or may remain unchanged. This may allow for the size of the correction table 316 to correspond to a slope of the INL error correction data, which is two bits. Accordingly, in such examples, the width of the correction table 316 may be reduced to two bits, thereby reducing the amount of space required in the correction table 316 to store the INL error correction data. In this example, the system 300 may be able to provide +/−7.5 least significant bits (LSB) of error correction (e.g., ~+/− 3.125 picoseconds at 20 gigabits per second) to the digital timing code 312, as described in more detail, herein.

In some embodiments, data from the correction table 316 (e.g., differentiated phase interpolator error correction data) may be used to generate a correction code 314. In some embodiments, the correction code 314 includes data corresponding to the mathematical additive inverse of the data from the correction table 316 (e.g., the mathematical additive inverse of the derivative of the timing error). For example, correction code 314 may be determined by multiplying the derivative of the data from the correction table 316 by negative 1 (−1).

As shown in FIG. 3, the controller 310 may be communicatively coupled to a phase interpolator 320. The phase interpolator 320 may include a first DAC 326-1 (also referred to herein as a main DAC), and a second DAC 326-N (also referred to herein as a correction DAC). Signals output from the DACs 326-1, ..., 326-N, as well as external clock signal CLK may be summed as indicated by summing block 327. The resulting output signal from summing block 327 may be sent to a mixer 328, and then transferred out of the phase interpolator 320 via interface 340.

DAC 326-1 and DAC 326-N may be configured to control operation of the phase interpolator 320. In some embodiments, DAC 326-1 may set a requested timing for the phase interpolator 320, and DAC 326-N may provide error correction to the timing of the phase interpolator 320. The main DAC 326-1 may be a 7 bit DAC, while the correction DAC 326-N may be configured to receive a 5 bit binary code from the controller 310. In some embodiments, the main DAC 326-1 may have a resolution of one least significant bit (LSB), and the correction DAC 326-N may have a resolution of one-half of one LSB.

The correction DAC 326-N may be configured to provide error correction to the timing code received by the main DAC 326-1. For example, the correction DAC 326-N may be configured to receive a 5 bit binary code (e.g., correction code 314) from the controller 310 via signal path 315-1 to provide error correction to the digital timing code 312 received by the main DAC 326-1. In some embodiments, the 5 bit binary code may include four one-half LSB magnitude bits and one direction bit. The four magnitude bits provide a total of 15 values (e.g., +/−15 one half LSB steps), which may allow for the correction DAC 326-N to provide +/−7½ LSBs of correction to the digital timing code 312. It will be appreciated that, although the four magnitude bits give rise to 16 total bits, the zero solution (e.g., the null) does not affect the correction, so 15 total values are provided by the four magnitude bits.

As one example, the DAC 326-N can provide steering operations for the phase interpolator 320. For example, the steering DAC 326-2 may be configured to steer a current from being in phase (e.g., from an I phase) to being in quadrature (e.g., to a Q phase), or vice versa. In one example, the steering may be provided by 3 binary bits and can be controlled via receipt of 4 bits from the direction correction (e.g., via signal path 315-2). In some embodiments, the 4 bit direction correction code stored in the direction correction 317 can include 3 magnitude bits and one direction bit. In some embodiments, the steering operations may be provided to increment or decrement a direction toward which the error correction is applied. Embodiments are not so limited; however, and the direction correction may be provided by less than 3 binary bits or by more than 3 binary bits.

FIG. 4A is an example of a digital timing code 412 in accordance with a number of embodiments of the present disclosure. In the example shown in FIG. 4A, the digital timing code 412 includes 8 bits: a first bit 431-1, a second bit 431-2, a third bit 431-3, a fourth bit 431-4, a fifth bit 431-5, a sixth bit 431-6, a seventh bit 431-7, and an eight bit 431-8. In some embodiments, the digital timing code 412 may be a binary digital timing code.

FIG. 4B is an example of a correction code 414 in accordance with a number of embodiments of the present disclosure. In the example shown in FIG. 4B, the correction code may comprise a binary code and may include 5 bits. In some embodiments, the 5 bit binary code may include four one-half LSB magnitude bits (e.g., a first one-half LSB magnitude bit 433-1, a second one-half LSB magnitude bit 433-2, a third one-half LSB magnitude bit 433-3, and a fourth one-half LSB magnitude bit 433-4), and one direction bit 435. Embodiments are not so limited; however, and the correction code 414 can include more than 5 bits or less than 5 bits depending, for example, on desired control of the granularity of the error correction to be applied.

Figure 5:
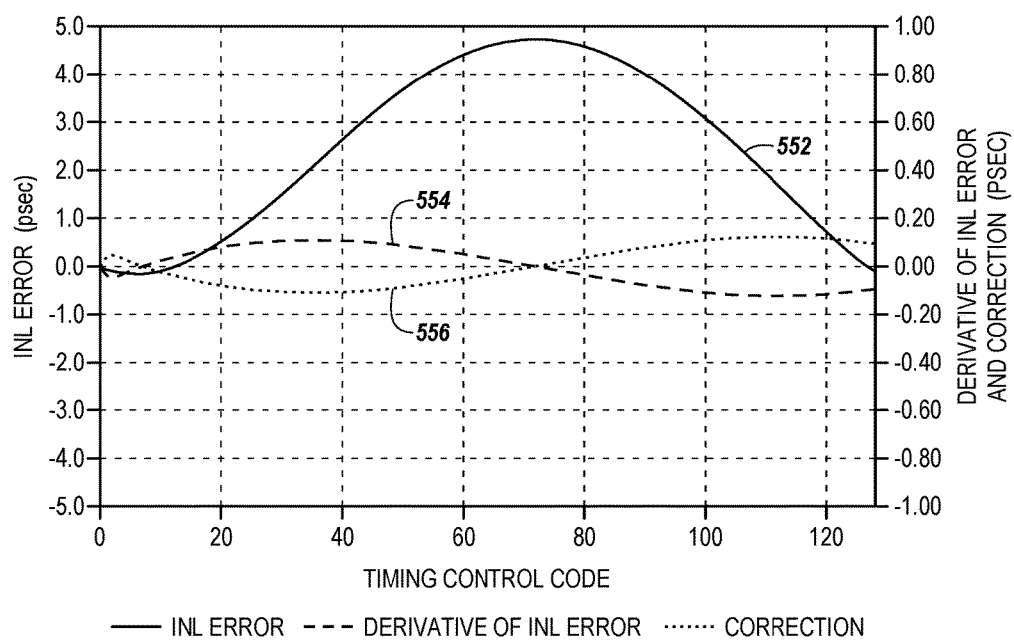
FIG. 5 is an example of curves illustrating a timing error, derivative of the timing error, and error correction applied to a phase interpolator in accordance with a number of embodiments of the present disclosure.

FIG. 5 is an example of curves illustrating a timing error, derivative of the timing error, and error correction applied to a phase interpolator in accordance with a number of embodiments of the present disclosure. The Curve 552 represents an INL error associated with a phase interpolator (e.g., phase interpolator 320 illustrated in FIG. 3).

The x-axis of the graph illustrated in FIG. 5 represents a digital timing code (e.g., digital timing code 312 illustrated in FIG. 3) as a function of time. The left y-axis represents the INL error (in picoseconds), while the right y-axis represents the derivative of the INL error and the error correction (in picoseconds).

Curve 554 represents the mathematical derivative of the INL error curve 552. For example, the INL error curve 552 may be differentiated to yield the derivative of the timing error illustrated by curve 554.

Curve 556 represents an error correction that may be applied to correct for non-linear delay behavior associated with the phase interpolator. In some embodiments, the error correction curve 556 is the mathematical additive inverse of the derivative of the timing error, which is shown in FIG. 5 by the dashed line 554. For example, the error correction curve 556 may be determined by multiplying the derivative of the timing error curve 554 by negative 1 (−1).

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a phase interpolator comprising a first digital to analog converter (DAC) having a resolution on the order of one least significant bit and configured to receive a digital timing code; and
 a second DAC having a resolution on the order of one half of one least significant bit and configured to receive a correction code, wherein the correction code is based, at least in part, on phase interpolator error correction data from a data structure containing phase interpolator error correction data; and
 a controller coupled to the phase interpolator and configured to provide the digital timing code to the phase interpolator,
  wherein the phase interpolator is configured to apply a correction to the received digital timing code based, at least in part, on the phase interpolator error correction data from the data structure.

2. The apparatus of claim 1, wherein application of the correction to the received digital timing code includes adjusting a phase of an output signal of the phase interpolator.

3. The apparatus of claim 1, wherein the data structure is stored in a storage location coupled to the controller.

4. The apparatus of claim 1, wherein the phase interpolator is configured to:
 generate a corrected timing signal based, at least in part, on the applied error correction; and
 output the corrected timing signal to a memory device coupled to the phase interpolator via an interface.

5. The apparatus of claim 1, wherein the digital timing code defines a particular step of the phase interpolator to which the correction is to be applied.

6. The apparatus of claim 1, wherein the phase interpolator is configured to apply a correction to the received digital timing code by computing an inverse of a derivative of a determined integral nonlinearity error associated with the phase interpolator.

7. An apparatus, comprising:
a phase interpolator; and
a controller coupled to the phase interpolator and configured to:
provide, to the phase interpolator, timing codes in association with adjusting a timing signal received by the phase interpolator;
access a data structure storing phase interpolator error correction data to determine particular error correction codes to provide to the phase interpolator in association with providing respective particular timing codes to the phase interpolator; and
cause a derivative of a determined integral nonlinearity error associated with the phase interpolator to be stored in the data structure containing the phase interpolator error correction data, and
wherein the phase interpolator comprises circuitry configured to:
adjust the respective particular digital timing codes received from the controller based, at least in part, on the respective particular error correction codes received from the controller.

8. The apparatus of claim 7, wherein the controller is further configured to cause an operation to be performed comprising multiplying a derivative of a determined integral nonlinearity error associated with the phase interpolator by negative 1 to yield the error correction codes.

9. The apparatus of claim 7, wherein the phase interpolator circuitry comprises a first digital to analog converter (DAC) and a second DAC.

10. The apparatus of claim 9, wherein the second DAC is to receive the data correction code from the controller, and wherein the data correction code at least a one-half least significant magnitude bit and at least one direction bit.

11. The apparatus of claim 9, wherein the first DAC has a resolution of one least significant bit and the second DAC has a resolution of one-half of one least significant bit.

12. The apparatus of claim 9, wherein the phase interpolator further comprises a third DAC to perform steering operations for the phase interpolator.

13. A system, comprising:
a phase interpolator;
a controller coupled to the phase interpolator; and
a device under test (DUT) coupled to the phase interpolator, wherein:
the phase interpolator is configured to: receive a digital timing code from the controller; and
apply error correction to the received digital timing code based, at least in part, on the phase interpolator error correction data from a data structure comprising phase interpolator error correction data stored by the controller; and
the DUT is configured to receive a corrected timing signal, wherein the corrected timing signal is based, at least in part, on the applied error correction.

14. The system of claim 13, wherein the phase interpolator comprises:
a first digital to analog converter (DAC) to receive the digital timing code from the controller;
a second DAC to receive a correction code based, at least in part, on the phase interpolator error correction data from the data structure comprising of phase interpolator error correction data; and
a mixer configured to:
receive a first signal from the first DAC;
receive a second signal from the second DAC; and
output the corrected timing signal to the DUT, wherein the corrected timing signal comprises at least a portion of the first signal and at least a portion of the second signal.

15. The system of claim 13, wherein the controller is configured to cause an operation to be performed comprising multiplying a derivative of a determined integral nonlinearity error associated with the phase interpolator by negative 1 to yield the corrected timing signal.

16. The system of claim 13, wherein the digital timing code defines a particular step of the phase interpolator to which error correction is to be applied.

17. The system of claim 13, wherein the data structure comprising the phase interpolator error correction data is based on a particular frequency at which the system is operated.

18. A method, comprising:
receiving a digital timing code at a first digital to analog converter (DAC) associated with a phase interpolator;
receiving a data correction code at a second DAC associated with the phase interpolator;
performing an error correction operation at the second DAC using the data correction code, wherein the error correction is based, at least in part, on a derivative of an integral nonlinearity error associated with the phase interpolator.

19. The method of claim 18, wherein the error correction is based, at least in part, on an inverse of the derivative of the integral nonlinearity error associated with the phase interpolator.

20. The method of claim 18, further comprising:
storing a change in the error correction for a previous error correction operation; and
using the change in the error correction for a subsequent error correction operation.

21. The method of claim 18, wherein receiving the data correction code comprises receiving a data correction code including at least a magnitude bit and at least one direction bit.

22. The method of claim 18, further comprising storing a derivative of a determined integral nonlinearity error associated with the phase interpolator in a data structure associated with a controller coupled to the phase interpolator.

23. The method of claim 18, further comprising selecting a step of the phase interpolator to which error correction is to be applied based, at least in part, on the digital timing code.

24. The method of claim 18, further comprising transmitting an error corrected timing signal to at least one of a device under test and a memory device, wherein the error corrected timing signal is based, at least in part, on the error correction.

25. An apparatus, comprising:
a phase interpolator; and
a controller coupled to the phase interpolator and configured to provide a digital timing code to the phase interpolator, wherein the phase interpolator is configured to:
apply a correction to the received digital timing code based, at least in part, on phase interpolator error correction data from a data structure containing phase interpolator error correction data;
generate a corrected timing signal based, at least in part, on the applied error correction; and
output the corrected timing signal to a memory device coupled to the phase interpolator via an interface.

26. An apparatus, comprising:
a phase interpolator; and
a controller coupled to the phase interpolator and configured to provide a digital timing code to the phase interpolator,
wherein the phase interpolator is configured to apply a correction to the received digital timing code by computing an inverse of a derivative of a determined integral nonlinearity error associated with the phase interpolator, and
wherein the correction is based, at least in part, on phase interpolator error correction data from a data structure containing phase interpolator error correction data.

27. An apparatus, comprising:
a phase interpolator; and
a controller coupled to the phase interpolator and configured to:
provide, to the phase interpolator, timing codes in association with adjusting a timing signal received by the phase interpolator;
access a data structure storing phase interpolator error correction data to determine particular error correction codes to provide to the phase interpolator in association with providing respective particular timing codes to the phase interpolator; and
cause an operation to be performed comprising multiplying a derivative of a determined integral nonlinearity error associated with the phase interpolator by negative 1 to yield the error correction codes, and
wherein the phase interpolator comprises circuitry is configured to adjust the respective particular digital timing codes received from the controller based, at least in part, on the respective particular error correction codes received from the controller.

28. An apparatus, comprising:
a phase interpolator; and
a controller coupled to the phase interpolator and configured to:
provide, to the phase interpolator, timing codes in association with adjusting a timing signal received by the phase interpolator; and
access a data structure storing phase interpolator error correction data to determine particular error correction codes to provide to the phase interpolator in association with providing respective particular timing codes to the phase interpolator; and
wherein the phase interpolator comprises a first digital-to-analog converter (DAC) having a resolution of one least significant bit and a second DAC having a resolution of one-half of one least significant bit, and
wherein the phase interpolator is configured to adjust the respective particular digital timing codes received from the controller based, at least in part, on the respective particular error correction codes received from the controller.

29. An apparatus, comprising:
a phase interpolator; and
a controller coupled to the phase interpolator and configured to:
provide, to the phase interpolator, timing codes in association with adjusting a timing signal received by the phase interpolator; and
access a data structure storing phase interpolator error correction data to determine particular error correction codes to provide to the phase interpolator in association with providing respective particular timing codes to the phase interpolator; and
wherein the phase interpolator comprises a first digital-to-analog converter (DAC), a second DAC, and a third DAC, the third DAC configured to perform steering operations for the phase interpolator, and
wherein the phase interpolator circuitry is configured to adjust the respective particular digital timing codes received from the controller based, at least in part, on the respective particular error correction codes received from the controller.

* * * * *